(12) United States Patent
Moreland

(10) Patent No.: US 6,686,864 B1
(45) Date of Patent: Feb. 3, 2004

(54) PIPELINED ANALOG-TO-DIGITAL CONVERTERS WITH GAIN-MATCHING STRUCTURES

(75) Inventor: Carl W. Moreland, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/229,039

(22) Filed: Aug. 28, 2002

(51) Int. Cl.[7] .............................................. H03M 1/38
(52) U.S. Cl. ...................................... 341/161; 341/155
(58) Field of Search ................................ 341/155, 156, 341/161, 162

(56) References Cited

U.S. PATENT DOCUMENTS

| | | | | |
|---|---|---|---|---|
| 5,534,864 A | * | 7/1996 | Ono et al. ................... | 341/156 |
| 5,572,212 A | * | 11/1996 | Levinson et al. ........... | 341/162 |
| 5,673,047 A | | 9/1997 | Moreland | |
| 6,124,818 A | * | 9/2000 | Thomas et al. ............. | 341/161 |
| 6,184,809 B1 | * | 2/2001 | Yu .............................. | 341/155 |
| 6,243,034 B1 | | 6/2001 | Regier | |
| 6,246,353 B1 | | 6/2001 | Elliott et al. | |
| 6,313,780 B1 | | 11/2001 | Hughes et al. | |
| 6,563,445 B1 | * | 5/2003 | Sabouri ...................... | 341/161 |
| 6,590,422 B1 | * | 7/2003 | Dillon ........................ | 341/156 |

* cited by examiner

Primary Examiner—Michael Tokar
Assistant Examiner—Lam T. Mai
(74) Attorney, Agent, or Firm—Koppel, Jacobs, Patrick & Heybl

(57) ABSTRACT

Pipelined ADC systems are provided with gain-matching structures that substantially eliminate gain errors between preceding and succeeding converter stages. These structures include reference signal-conditioning elements which mimic at least one of main signal-conditioning elements in the succeeding converter stages. The reference signal-conditioning elements control reference signals which maintain a match between the full-scale range of a digital-to-analog converter (DAC) in a succeeding stage and the "gained-up" step size of a DAC in a preceding stage. This match substantially eliminates the gain errors.

27 Claims, 4 Drawing Sheets

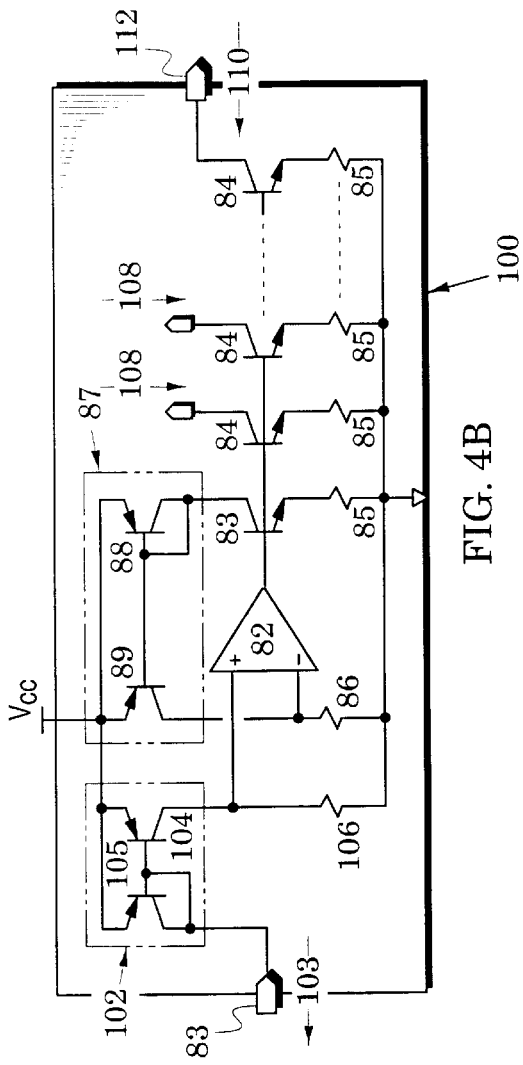
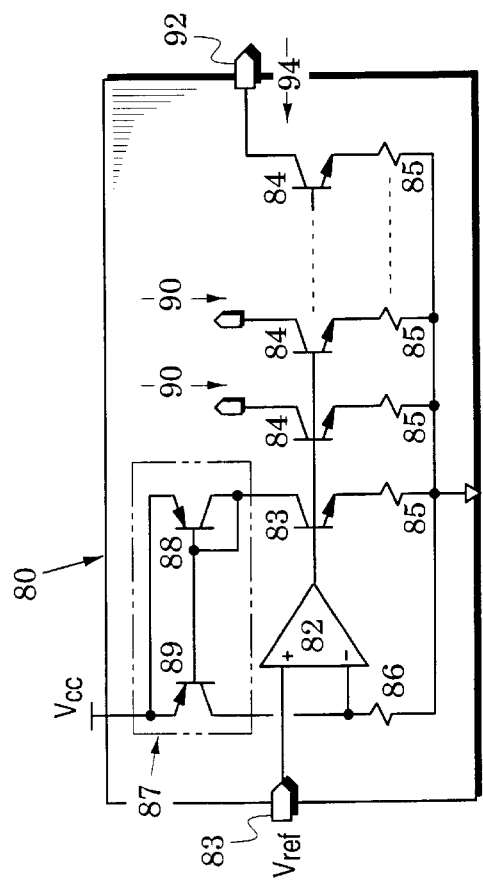
FIG. 4B
FIG. 4A

PIPELINED ANALOG-TO-DIGITAL CONVERTERS WITH GAIN-MATCHING STRUCTURES

BACKGROUND OF THE INVENTION

1. Field of the Invention

The present invention relates generally to pipelined analog-to-digital converters.

2. Description of the Related Art

Modern pipelined analog-to-digital converter (ADC) systems can obtain high resolution and high speed in converting analog input signals $S_{in}$ to digital output signals $S_{out}$. These systems realize their resolution and speed by pipelining input signals along succeeding converter stages.

These systems, however, are prone to generate code errors at the transition steps of digital-to-analog converters (DACs) in the succeeding converter stages. Although succeeding DACs have been slaved to preceding DACs in attempts to reduce these errors, these efforts have generally failed to eliminate the problem.

BRIEF SUMMARY OF THE INVENTION

The present invention is directed to pipelined ADC system embodiments which provide gain matching structures that substantially eliminate gain errors between preceding and succeeding converter stages.

The invention recognizes that gain across main signal-conditioning elements of pipelined ADC systems will vary with process and temperature variations and generate code errors in digital output signals $S_{out}$. In response to this recognition, the invention provides reference signal-conditioning elements that mimic at least one of the main signal-conditioning elements. The reference signal-conditioning elements control a reference signal to a succeeding digital-to-analog converter (DAC) so that a match is maintained between the full-scale range of the succeeding DAC and the "gained-up" step size of a preceding DAC. This match substantially eliminates the code errors.

The novel features of the invention are set forth with particularity in the appended claims. The invention will be best understood from the following description when read in conjunction with the accompanying drawings.

BRIEF DESCRIPTION OF THE DRAWINGS

FIGS. 4A and 4B are schematics that illustrate digital-to-analog converter (DAC) embodiments at opposite ends of a reference pipeline in FIG. 2.

DETAILED DESCRIPTION OF THE INVENTION

Figure 1:
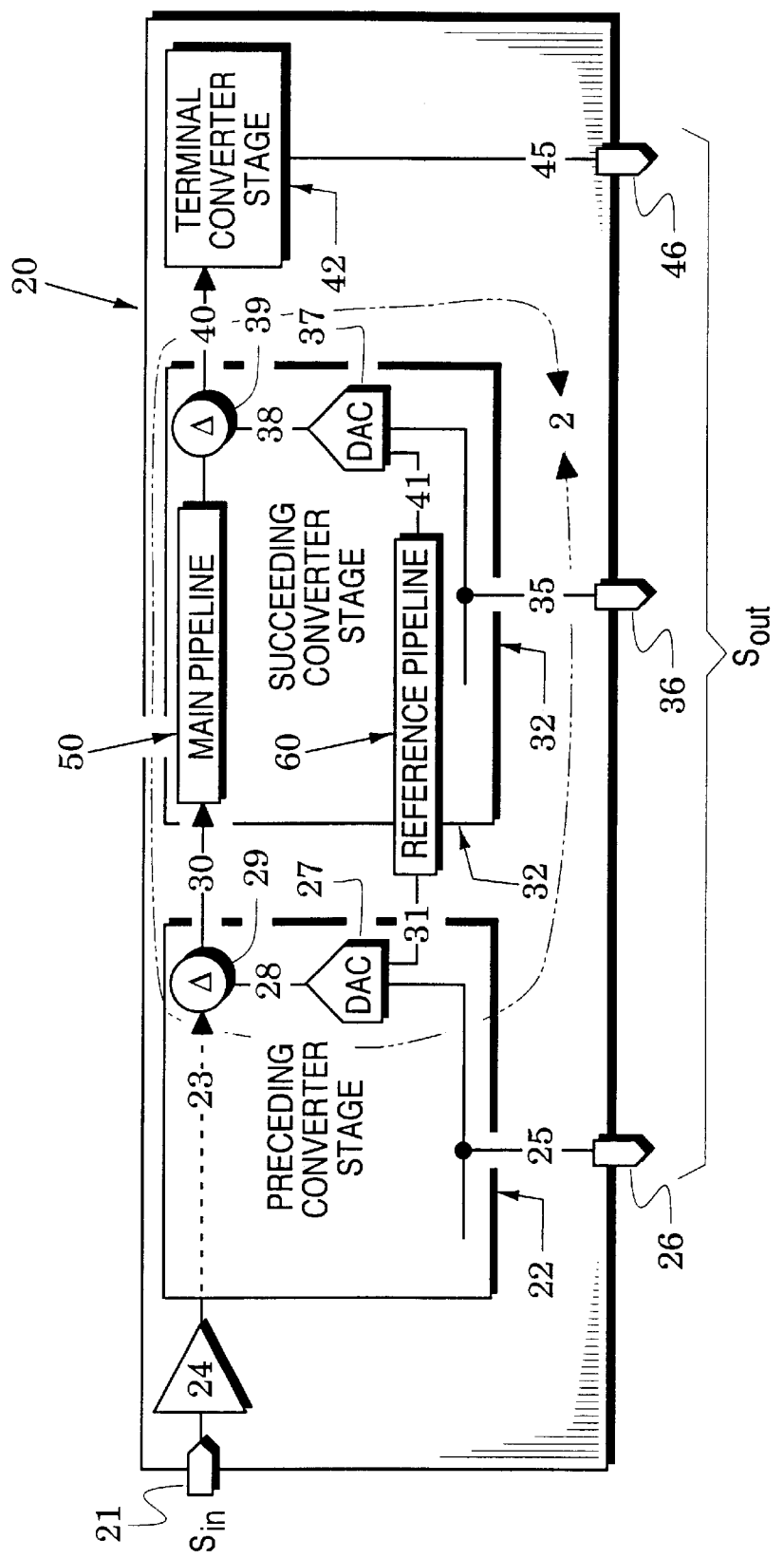
FIG. 1 is a block diagram of a pipelined ADC system embodiment of the present invention.

FIG. 1 illustrates a pipelined analog-to-digital converter system 20 that converts an analog input signal $S_{in}$ to a corresponding digital output signal $S_{out}$ and that includes a reference pipeline 60 of reference signal-conditioning elements that mimic at least one of main signal-conditioning elements in a main pipeline 50. The reference pipeline 60 processes a preceding reference signal 31 into a succeeding reference signal 41 to thereby reduce gain errors (due, for example, to process-induced variations in transistor parameters such as Early voltage $V_A$ and current gain $\beta$) and substantially enhance the performance of the converter system 20.

In particular, FIG. 1 illustrates a preceding converter stage 22 that receives successive samples 23 of the analog input signal $S_{in}$ from a sampler 24 (samplers are also commonly referred to as track-and-holds and as sample-and-holds). An ADC (not shown) in the preceding converter stage converts each sample to respective bits 25 (of the digital output signal $S_{out}$) at an output port 26.

A digital-to-analog converter (DAC) 27 converts the respective bits to a corresponding analog signal 28 which is subtracted from the sample in a differencer 29 to form a respective residue signal 30. The DAC 27 performs its conversion with a respective conversion gain that varies in accordance with its respective reference signal 31.

A succeeding converter stage 32 processes the residue signal 30 in a manner similar to that in which the preceding converter stage 24 processed its samples 23. That is, it converts the residue signal 30 to respective bits 35 (of the digital output signal $S_{out}$) at an output port 36 (with an ADC that is not shown) and has a DAC 37 which converts the respective bits to a corresponding analog signal 38 that is subtracted from a processed version of the residue signal 30 in a differencer 39 to form a respective residue signal 40. The DAC 38 also performs its conversion with a respective conversion gain and this gain varies in accordance with a respective reference signal 41.

Although other system embodiments of the invention may comprise additional successive converter stages similar to the converter stage 32, the system 20 of FIG. 1 terminates with a terminal converter stage 42 that converts the residue signal 40 to respective bits 45 (of the digital output signal $S_{out}$) at an output port 46.

In the succeeding converter stage 32, the main pipeline 50 of main signal-conditioning elements interacts with that converter stage's DAC 37 to processes the preceding residue signal 30 into the succeeding residue signal 40. In an important feature of the invention, the reference pipeline 60 is formed of reference signal-conditioning elements that mimic at least one of the main signal-conditioning elements in the main pipeline 50.

The performance enhancement of the reference pipeline 60 becomes more apparent when the structure within the curved line 2 of FIG. 1 is closely examined. This examination is facilitated by FIG. 2 which includes previously-described elements of FIG. 1 with like elements indicated by like reference numbers. In addition, FIG. 2 shows that the main pipeline 50 includes the serially-coupled elements of a main amplifier 51, a main sampler 52, a second main sampler 53 and a main buffer 54.

Figure 3:
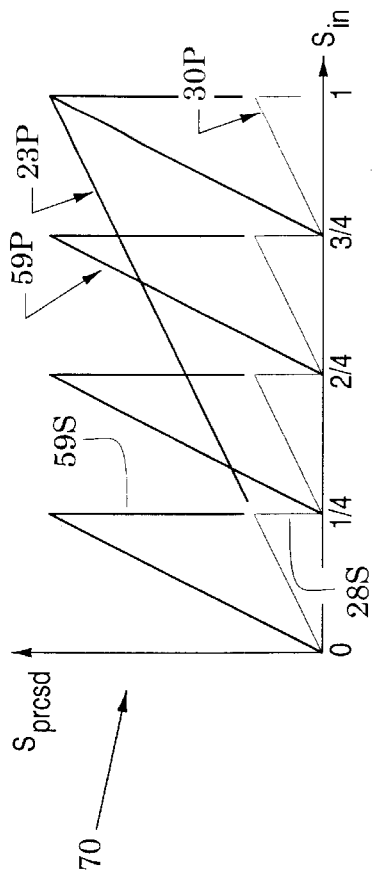
FIG. 3 is a graph that illustrates residue and gained-up residue signals in the embodiment of FIG. 2.
Figure 2:
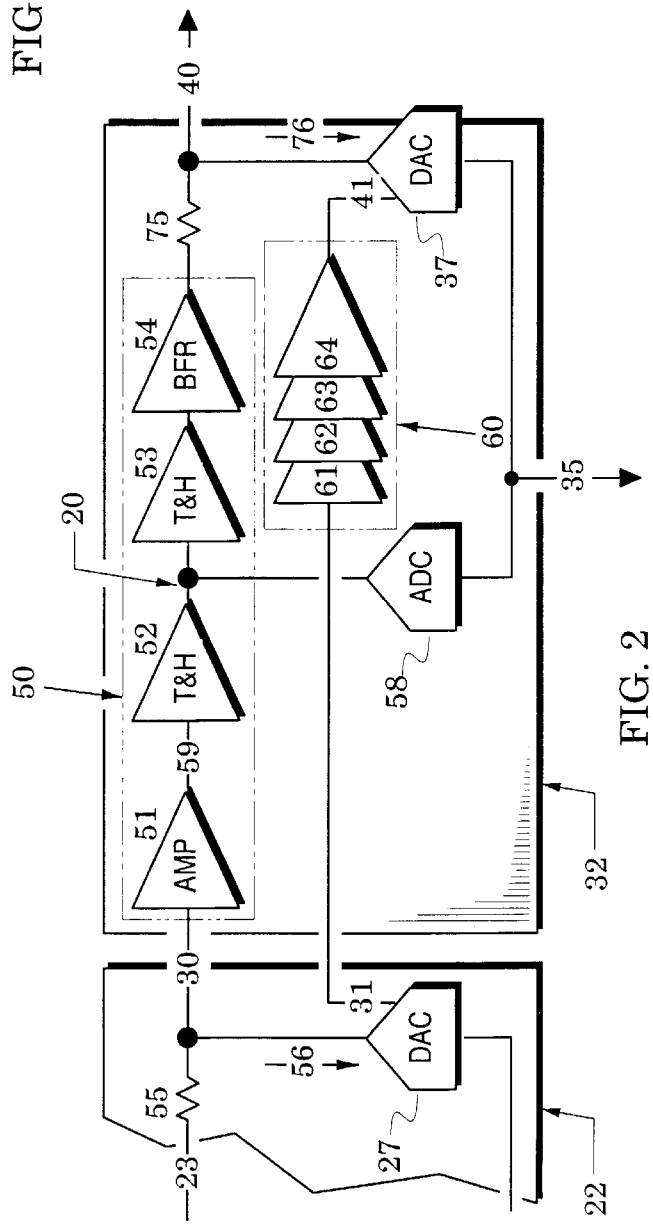
FIG. 2 is a schematic that illustrates converter stage embodiments of the structure within the curved line 2 of FIG. 1.

In FIG. 2, the differencer 29 of FIG. 1 is realized as a resistor 55 and the preceding analog signal 28 is realized as a current 56 that the preceding DAC 27 pulls across the resistor 55 to thereby subtract the preceding analog signal from the sampled signal 23. FIG. 3 is a graph 70 of processed signals $S_{prcsd}$ in which a plot 23P shows the sampled signal (23 in FIG. 2) as a function of the analog input signal (21 in FIG. 1).

For the illustrative purposes of the graph 70, it is assumed that an ADC in the preceding converter stage (22 in FIG. 2)

is configured to provide 2 respective bits of the digital output signal ($S_{out}$ in FIG. 1). Accordingly, the preceding DAC 27 steps the current 56 when the sampled signal 23 moves across the boundary that marks ¼ of the full-scale range of the analog input signal $S_{in}$. The stepped current 56 causes a plot 30P of the residue signal (30 in FIG. 2) to step downwards as indicated by step 28S in FIG. 3.

As the sampled signal 23 of FIG. 2 continues to increase, the DAC 27 again steps the current 56 as the sampled signal 23 moves across the boundaries that mark ½ and ¾ of the full-scale range of the analog input signal $S_{in}$. The stepped current 56 causes the residue signal plot 30S to again step downwards at the boundary marks ½ and ¾ in FIG. 3. It is noted that the stepped currents of the DAC 27 cause the plot 30P in FIG. 3 to have a peak amplitude ¼ that of the peak amplitude of the plot 23P.

After signal conditioning in the main amplifier 51 and the main sampler 52, the residue signal 30 of FIG. 2 is converted to respective bits in an ADC 58 of the succeeding converter stage 32. To enhance the accuracy of this conversion, it is desirable to "gain up" the residue signal 30 so that the full scale range of the ADC 58 is substantially the same as that of an ADC in the preceding converter stage 22.

Accordingly, the main amplifier 51 is set for a gain of four to thereby provide a "gained up" residue signal 59 to the ADC 58. The plot 59P of FIG. 3 illustrates the "gained up" residue signal 59 and shows that the steps 28S have been amplified to "gained up" residue steps 59S.

At this point, it is noted that the respective bits (26, 36 and 46 in FIG. 1) are generally processed (e.g., by buffer registers and error correction logic) to properly encode the digital output signal $S_{out}$. The number of respective bits may also be greater than those in the final digital output signal to allow the processing to relax the accuracy requirement of the succeeding converter stage 22.

Returning now to FIG. 2, a resistor 75 forms the differencer 39 of FIG. 1 and the succeeding analog signal (38 in FIG. 1) is realized as a current 76 that the succeeding DAC 37 pulls across the resistor 75 to thereby subtract the succeeding analog signal (38 in FIG. 1) from the analog output of the main pipeline 50 to generate the residue signal 40 of the succeeding converter stage 32. It is important that the full-scale range of the succeeding DAC 37 closely match the step size (59S in FIG. 3) of the "gained up" residue signal 59.

If this is not the case, the succeeding DAC 37 will introduce errors (e.g., long or short codes) in the digital output signal ($S_{out}$ in FIG. 1) at the transition steps of the preceding DAC 27. As mentioned in the description of the related art, this match has generally been approached by slaving the succeeding reference signal 41 to the preceding reference signal 31.

This slaving, however, fails to recognize gain errors that are introduced by the signal-conditioning elements of the main pipeline 50 of FIG. 2. The initial one of these elements is the main amplifier 51 which "gains up" the residue signal 30. This amplifier is generally followed by the main sampler 52 which provides a sampled signal for conversion by the ADC 58. The second main sampler 53 typically follows the main sampler in order to match the time delay involved in the conversion process of the ADC 58. The elements generally terminate with the buffer amplifier 54 which provides signal isolation between the second main sampler 53 and the subtraction process of the successive DAC 37 and its associated resistor 75.

Although feedback signals could be used to stabilize the gain of these signal conditioning elements, high-speed converter systems generally require open-loop elements to enhance conversion speed. Open-loop elements, however, introduce gain errors that result, for example, from transistor parameters (such as Early voltage $V_A$ and current gain β) that are inevitably less than ideal.

The invention recognizes that the gain across the main pipeline 50 will therefore vary with process and temperature variations and this variation will generate a mismatch between the full-scale range of the succeeding DAC 37 and the step size (59S in FIG. 3) of the "gained up" residue signal 59 of FIG. 2. Accordingly, code errors will be introduced in the digital output signal ($S_{out}$ in FIG. 1) at the transition steps of the preceding DAC 27.

As shown in the converter embodiment of FIG. 2, the invention inserts the reference pipeline 60 to condition the preceding reference signal 31 into the succeeding reference signal 41. The reference pipeline 60 is formed with reference signal-conditioning elements that mimic at least one of the main signal-conditioning elements of the main pipeline 50. In the particular embodiment of FIG. 2, the reference pipeline includes a reference amplifier 61, a reference sampler 62, a second reference sampler 63 and a reference buffer 64 that each mimic a respective signal-conditioning element in the main pipeline 50.

Although a referenced signal-conditioning element need not be an exact copy of its its respective main signal-conditioning element, the gain-determining structures and processes of each reference signal-conditioning should closely resemble the gain-determining structures and processes of its respective main signal-conditioning element. For example, a differential pair of amplifiers in the main amplifier 51 or the main buffer 54 is mimicked by a corresponding differential pair in the reference amplifier 61 or the reference buffer 64. As a second example, a diode-coupled transistor that passes a signal to a capacitor in the main sampler 52 or the second main sampler 53 is mimicked by a corresponding diode-coupled transistor and capacitor in the reference sampler 62 or the second reference sampler 63.

In operation of the succeeding converter stage 32 of FIG. 2, gain errors in the main pipeline 50 will typically introduce errors in the succeeding residue signal 40 (due, for example, to variations in transistor parameters). Because its signal-conditioning elements mimic the signal-conditioning elements of the main pipeline 50, the reference pipeline 60 will mimic those gain errors and alter the succeeding reference signal 41 so that the full-scale range of the succeeding DAC 37 continues to match the "gained-up" step size (59S in FIG. 3) of the preceding DAC 27. It has been found that this operation substantially eliminates gain errors in pipelined ADC systems.

Attention is now directed FIG. 4A which shows typical structure in a current-controlled DAC 80. A differential amplifier 82 receives, at one input, a reference voltage $V_{ref}$ (preferably, from a bandgap-voltage reference) from a reference port 83 and drives bases of a feedback transistor 83 and a plurality of current-source transistors 84 that are each coupled to a respective emitter resistor 85. A feedback resistor 86 is coupled to another input of the differential amplifier 82 and a feedback current mirror 87 (formed of base and collector-coupled first and second transistors 88 and 89 wherein the first transistor is diode-coupled) couples the collector of the feedback transistor 83 to the feedback resistor 86.

In operation of the current-controlled DAC 80, the feedback action of the feedback current mirror 87 generates a current in the feedback transistor 83 that is mirrored by the current mirror to a mirrored current across the feedback resistor 86. This generates a feedback voltage and the feedback action causes the mirrored current to be sufficient to cause the feedback voltage to substantially match the reference voltage $V_{ref}$.

Because they are base-coupled to the feedback transistor 83, the current-source transistors 84 then provide controlled currents 90 which can be switched by transistor switches (not shown) that respond to a digital input signal (not shown). Accordingly, the switched currents 90 form an analog output signal in response to the digital input signal. In different DAC embodiments, the emitter resistors 85 and/or the current-source transistors 84 may be sized to realize various relationships (e.g, binary relationships) in the controlled currents 90.

One of the current-source transistors 84 can be coupled to a reference port 92 to thereby provide a reference current 94 whose variations mimic any variations (e.g., due to process or temperature) in the controlled currents 90.

FIG. 4B shows another current-controlled DAC 100 that is similar to the current-controlled DAC 80 of FIG. 4A with like elements indicated by like reference numbers. In addition, the DAC 100 has a current mirror 102 (formed of base and collector-coupled first and second transistors 104 and 105 wherein the second transistor is diode-coupled) that receives a reference current 103 from the reference port 83 and mirrors it to generate a reference voltage across a reference resistor 106 that is coupled to one input of the differential amplifier 82.

Operation of the current-controlled DAC 100 is similar to that of the current-controlled DAC 80 except that the reference voltage $V_{ref}$ of FIG. 4A is now generated as a function of the reference current 103. If the reference current is provided by the current-controlled DAC 80 of FIG. 4A (e.g., reference current 94), then currents 108 of the current-controlled DAC 100 will mimic any current variations (e.g., due to process or temperature) in the controlled currents 90 of the DAC 80. As in the DAC 80, one of the controlled currents of the DAC 100 can be supplied to a succeeding converter stage as a reference current 110 at a reference port 112.

The current-controlled DACs 80 and 100 of FIGS. 4A and 4B are especially suited for use as the preceding and succeeding. DACs 27 and 37 of FIG. 2 wherein the preceding reference current 31 of FIG. 2 would be the reference current 94 of FIG. 4A and the succeeding reference current 41 of FIG. 2 would be the reference current 103 of FIG. 4B. Because the input and output signals of the reference pipeline 60 of FIG. 2 are generally voltage signals, a current-to-differential voltage converter is preferably inserted at the input of the reference pipeline and a differential voltage-to-current converter is preferably inserted at the output of the reference pipeline 60.

Figure 5:
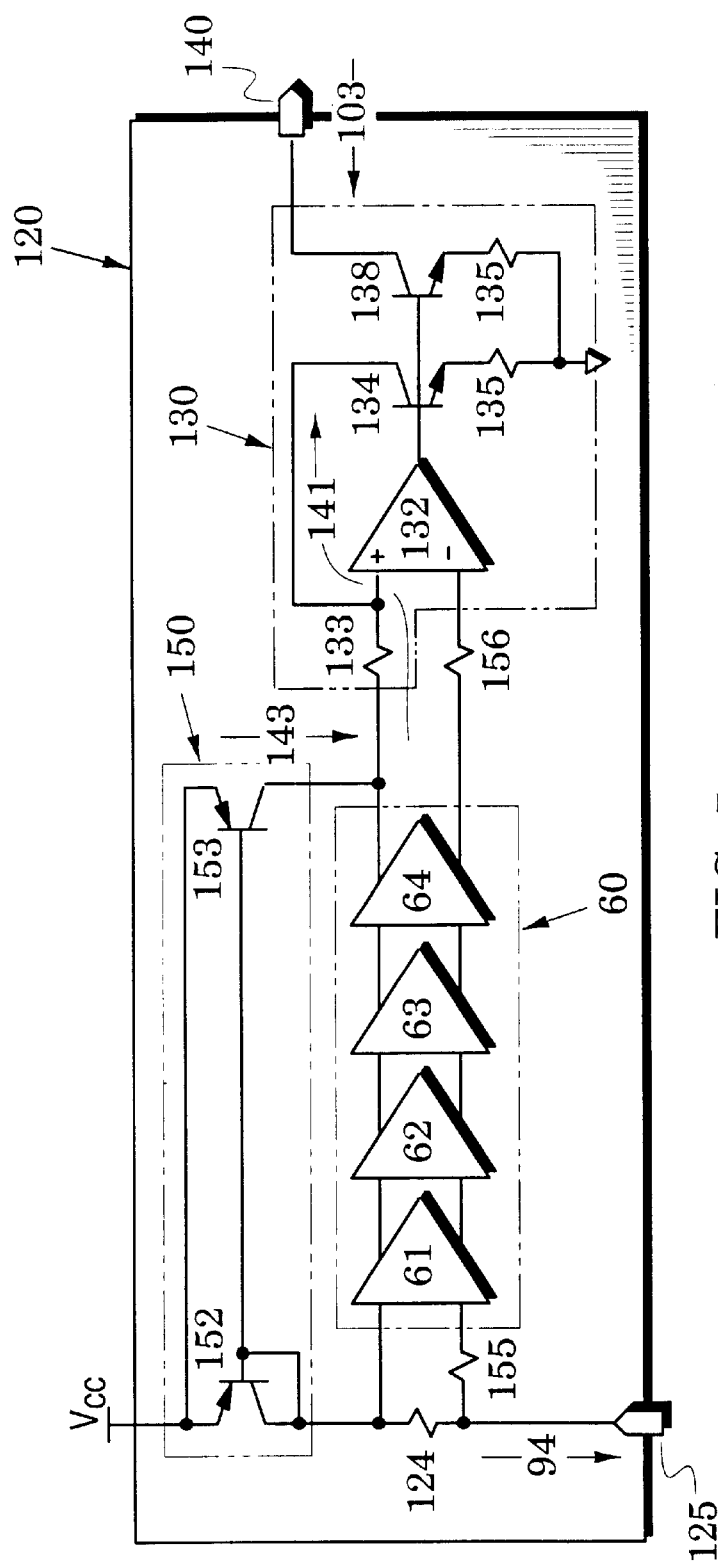
FIG. 5 is a schematic that illustrates another embodiment of the reference pipeline in FIG. 2.

FIG. 5 illustrates a reference pipeline 120 that includes these insertions. The reference pipeline 120 positions the reference pipeline 60 of FIG. 2 and its signal-conditioning elements 61–64 after a current-to-differential voltage converter that is realized by an input resistor 124 which receives the reference current 94 of FIG. 4A at a reference port 125 and generates a differential voltage that drives the differential input of the reference pipeline 60.

The reference pipeline also positions a differential voltage-to-current converter 130 after the reference pipeline 60. The converter 130 is formed by a differential amplifier 132 that receives the differential output of the reference pipeline 60 at the amplifier's differential input with an input resistor 133 inserted in a first side of that input. The differential amplifier drives the base of a feedback transistor 134 that has an emitter resistor 135 and has its collector fed back to the first side. A current-source transistor 138 also has an emitter resistor 133 and has its collector coupled to a reference port 140 to provide the reference current 103 of the current-controlled DAC 100 of FIG. 4B.

In operation of the converter 130, feedback around the differential amplifier 132 causes it to drive feedback transistor 134 so that it pulls a feedback current 141 through the input resistor 133 that is sufficient to convert the differential voltage at the output of the reference pipeline 60 to the substantially-zero voltage at the inputs of the differential amplifier 132. Because transistors 134 and 138 are base-coupled, the current-source transistor 138 generates the reference current 103 at the reference port 140. The reference current 103 can be adjusted with appropriate scaling of the current-source transistor or of its emitter resistor 135.

It is noted that a current imbalance may be created in the reference buffer 64 because it has to supply the input current 141 at one output and not at the other output. This imbalance can be substantially eliminated by providing a null current 143 that provides the input current 141. The null current is provided by a current mirror 150 (formed of base and collector-coupled first and second transistors 152 and 153 wherein the first transistor is diode-coupled) which mirrors the reference current 94 to generate the null current 143 (the second transistor 153 can be scaled to alter the amplitude of the null current).

It is further noted that input currents at the reference amplifier 61 and the differential amplifier 132 may cause voltage offsets because they flow through resistors at one port of these amplifier's differential inputs. These offsets are substantially eliminated by inserting input resistors 155 and 156 at the other port that respectively match the resistance of the input resistor 124 and the input resistor 133. As a result, input currents will not generate differential voltage signals.

It was stated above that the current-source transistor 138 of FIG. 5 provides the reference current 103 to the current-controlled DAC 100 of FIG. 4B. In another converter embodiment of the invention, the current-source transistor 138 (and its emitter resistor 135) are simply duplicated to form a set of current-source transistors 138 (or scaled versions of the current-source transistor 138) which themselves provide the current-source functions of the transistors 84 of FIG. 4B. That is, the set of current-source transistors 138 become the current sources of the succeeding DAC 37 of FIG. 2. In this embodiment, the succeeding reference signal (41 in FIG. 1) is a voltage signal at the output of the reference buffer 64 and the feedback current 141 essentially serves as a reference current for the succeeding DAC.

Pipelined ADC system embodiments have been disclosed which provide gain matching structures that substantially eliminate gain errors between preceding and succeeding converter stages. These structures take the form of reference pipelines that correct DAC reference signals to thereby prevent coding errors in the digital output signals $S_{out}$ of the pipelined systems.

Although embodiments of the invention have been illustrated with reference to bipolar junction transistors, the teachings of the invention can be realized with other transistor types (e.g., complementary metal-oxide-semiconductor (CMOS) transistors).

The embodiments of the invention described herein are exemplary and numerous modifications, dimensional variations and rearrangements can be readily envisioned to achieve an equivalent result, all of which are intended to be embraced within the scope of the appended claims.

I claim:

1. A pipelined analog-to-digital converter system that converts an analog input signal to a corresponding digital output signal, the system comprising:

successive converter stages that each provides respective bits of said digital output signal and provides a respective residue signal to a succeeding converter stage with the aid of a respective digital-to-analog converter (DAC) that converts said respective bits with a respective conversion gain that varies in accordance with a respective reference signal wherein at least one of said converter stages includes a main pipeline of main signal-conditioning elements that interact with a respective DAC to process a preceding residue signal into a succeeding residue signal; and a reference pipeline of reference signal-conditioning elements that mimic at least one of said main signal-conditioning elements wherein said reference pipeline processes a preceding reference signal into a succeeding reference signal.

2. The system of claim 1, wherein:
said main signal-conditioning elements include:
 a) a main amplifier; and
 b) a main sampler; and
said reference signal-conditioning elements include:
 a) a reference amplifier that mimics said main amplifier; and
 b) a reference sampler that mimics said main sampler.

3. The system of claim 2, wherein:
said main signal-conditioning elements further include:
 a) a second main sampler; and
 b) a main buffer; and
said reference signal-conditioning elements further include:
 a) a second reference sampler that mimics said second main sampler; and
 b) a reference buffer that mimics said main buffer.

4. The system of claim 1, wherein said preceding reference signal is a preceding current and said succeeding reference signal is a succeeding current and further including:

a current-to-voltage converter that drives said reference pipeline in response to said preceding current; and a voltage-to-current converter that provides said succeeding current in response to said reference pipeline.

5. The system of claim 4, wherein said current-to-voltage converter is an initial resistor and said voltage-to-current converter includes:

a feedback-controlled differential amplifier that provides said succeeding current in response to an input current; and a terminal resistor that couples said differential amplifier to said reference pipeline to thereby generate said input current.

6. The system of claim 5, further including a current mirror that mirrors said preceding current to thereby provide said input current.

7. The system of claim 1, wherein at least one of said converter stages includes a resistor that couples said main pipeline and said succeeding DAC to facilitate processing of said preceding residue signal into succeeding residue signal.

8. The system of claim 1, further including a terminal converter stage that converts a residue signal of a preceding stage into terminal bits of said digital output signal.

9. The system of claim 1, further including a sampler that provides samples of said input analog signal to an initial one of said converter stages.

10. A pipelined analog-to-digital converter system that converts an analog input signal to a corresponding digital output signal, the system comprising:

a preceding converter stage that provides preceding bits of said digital output signal and provides a preceding residue signal with the aid of a preceding digital-to-analog converter (DAC) that converts said preceding bits with a preceding conversion gain that varies in accordance with a preceding reference signal;

a succeeding converter stage that provides succeeding bits of said digital output signal and processes said preceding residue signal into a succeeding residue signal with a main pipeline of main signal-conditioning elements and a succeeding DAC that converts said succeeding bits with a succeeding conversion gain that varies in accordance with a succeeding reference signal; and in said succeeding converter stage, a reference pipeline of reference signal-conditioning elements that each mimic a corresponding one of said main signal-conditioning elements wherein said reference pipeline processes said preceding reference signal into said succeeding reference signal.

11. The system of claim 10, wherein:
said main signal-conditioning elements include:
 a) a main amplifier; and
 b) a main sampler; and
said reference signal-conditioning elements include:
 a) a reference amplifier that mimics said main amplifier; and
 b) a reference sampler that mimics said main sampler.

12. The system of claim 11, wherein:
said main signal-conditioning elements further include:
 a) a second main sampler; and
 b) a main buffer; and
said reference signal-conditioning elements further include:
 a) a second reference sampler that mimics said second main sampler; and
 b) a reference buffer that mimics said main buffer.

13. The system of claim 10, wherein said preceding reference signal is a preceding current and said succeeding reference signal is a succeeding current and further including:

a current-to-voltage converter that drives said reference pipeline in response to said preceding current; and a voltage-to-current converter that provides said succeeding current in response to said reference pipeline.

14. The system of claim 13, wherein said current-to-voltage converter is an initial resistor and said voltage-to-current converter includes:

a feedback-controlled differential amplifier that provides said succeeding current in response to an input current; and a terminal resistor that couples said differential amplifier to said reference pipeline to thereby generate said input current.

15. The system of claim 14, further including a current mirror that mirrors said preceding current to thereby provide said input current.

16. The system of claim 10, wherein said succeeding converter stage includes a resistor that couples said main pipeline and said succeeding DAC to facilitate processing of said preceding residue signal into said succeeding residue signal.

17. The system of claim 10, further including a terminal converter stage that converts a residue signal of a preceding stage into terminal bits of said digital output signal.

18. The system of claim 10, further including a sampler that provides samples of said input analog signal to an initial one of said converter stages.

19. A pipelined analog-to-digital converter (ADC) that converts an analog input signal to a corresponding digital output signal, comprising:

a preceding converter stage that includes:
   a) a preceding ADC that converts said analog input signal into preceding bits of said digital output signal;
   b) a preceding pipeline of preceding signal-conditioning elements that processes said analog input signal into a preceding pipelined signal; and
   c) a preceding digital-to-analog converter (DAC) that converts said preceding bits to a preceding analog signal with a conversion gain in accordance with a preceding reference signal and subtracts said preceding analog signal from said preceding pipelined signal to generate a preceding residue signal; and a succeeding converter stage that includes:
   a) a succeeding pipeline of succeeding signal-conditioning elements that processes said preceding residue signal into first and second succeeding pipelined signals;
   b) a succeeding ADC that converts said first succeeding pipelined signal into succeeding bits of said digital output signal;
   c) a reference pipeline of reference signal-conditioning elements that mimic at least one of said succeeding signal-conditioning elements wherein said reference pipeline processes said preceding reference signal into a succeeding reference signal; and
   c) a succeeding DAC that converts said succeeding bits to a succeeding analog signal with a conversion gain in accordance with said succeeding reference signal and subtracts said succeeding analog signal from said second succeeding pipelined signal to generate a succeeding residue signal.

20. The converter of claim 19, wherein:
said succeeding signal-conditioning elements include:
   a) a succeeding amplifier; and
   b) a succeeding sampler; and
said reference signal-conditioning elements include:
   a) a reference amplifier that mimics said succeeding amplifier; and
   b) a reference sampler that mimics said succeeding sampler.

21. The converter of claim 20, wherein:
said succeeding signal-conditioning elements further include:
   a) a second succeeding sampler; and
   b) a succeeding buffer; and
said reference signal-conditioning elements further include:
   a) a second reference sampler that mimics said second succeeding sampler; and
   b) a reference buffer that mimics said succeeding buffer.

22. The converter of claim 19, wherein:
said preceding DAC is structured to adjust the amplitude of said preceding reference signal in accordance with the amplitude of said preceding analog signal; and
said succeeding DAC is structured to adjust the amplitude of said succeeding analog signal in accordance with the amplitude of said succeeding reference signal.

23. The converter of claim 19, wherein said preceding reference signal is a preceding current and said succeeding reference signal is a succeeding current and further including:
a current-to-voltage converter that drives said reference pipeline in response to said preceding current; and
a voltage-to-current converter that provides said succeeding current in response to said reference pipeline.

24. The converter of claim 23, wherein said current-to-voltage converter is an initial resistor and said voltage-to-current converter includes:
a feedback-controlled differential amplifier that provides said succeeding current in response to an input current; and
a terminal resistor that couples said differential amplifier to said reference pipeline to thereby generate said input current.

25. The converter of claim 19, further including:
a preceding resistor coupled between said preceding pipeline and said preceding DAC to facilitate generation of said preceding residue signal; and
a succeeding resistor coupled between said succeeding pipeline and said succeeding DAC to facilitate generation of said succeeding residue signal.

26. The converter of claim 19, further including a terminal ADC that converts said succeeding residue signal into respective terminal bits of said digital output signal.

27. The converter of claim 19, further including a sampler that precedes said preceding converter stage to provide a samples of said input analog signal to said preceding ADC.

* * * * *